United States Patent [19]

Noguchi

[11] Patent Number: 5,694,050
[45] Date of Patent: Dec. 2, 1997

[54] MULTIPROBING SEMICONDUCTOR TEST METHOD FOR TESTING A PLURALITY OF CHIPS SIMULTANEOUSLY

[75] Inventor: Etsuo Noguchi, Mitaka, Japan

[73] Assignee: Tokyo Seimitsu Co., Ltd., Tokyo, Japan

[21] Appl. No.: 612,760

[22] Filed: Mar. 8, 1996

Related U.S. Application Data

[63] Continuation of Ser. No. 153,466, Nov. 17, 1993, abandoned.

[30] Foreign Application Priority Data

Nov. 30, 1992 [JP] Japan .................................. 4-320061

[51] Int. Cl.$^6$ .................................................. G01R 31/02
[52] U.S. Cl. ...................................................... 324/765
[58] Field of Search ........................... 324/754, 72.5, 324/73.1, 158.1, 765, 760; 437/8; 257/40, 48

[56] References Cited

U.S. PATENT DOCUMENTS

| | | | |
|---|---|---|---|
| 3,781,683 | 12/1973 | Freed | 324/765 |
| 4,899,107 | 2/1990 | Corbett et al. | 324/765 |
| 4,967,146 | 10/1990 | Morgan et al. | 324/765 |
| 5,070,297 | 12/1991 | Kwon et al. | 324/754 |

*Primary Examiner*—Vinh P. Nguyen
*Attorney, Agent, or Firm*—Nikaido Marmelstein Murray & Oram LLP

[57] ABSTRACT

The purpose of the test method is to improve test efficiency in a semiconductor test method utilizing multiprobing. The semiconductor test method involves placing probes into contact with the electrode pads of semiconductor chips on a semiconductor wafer with a test head providing and receiving test signals through the probes thereby checking the electrical properties of the semiconductor chips sequentially. According to the test method, in order to test a plurality of adjacent semiconductor chips simultaneously, as many probes are provided as the number of semiconductor chips to be tested simultaneously, the test head is capable of providing and receiving test signals for the plurality of semiconductor chips simultaneously, and the number of semiconductor chips that are tested simultaneously is determined without being limited to a power of 2.

4 Claims, 6 Drawing Sheets

MULTIPROBING SEMICONDUCTOR TEST METHOD FOR TESTING A PLURALITY OF CHIPS SIMULTANEOUSLY

This application is a continuation of application Ser. No. 08/153,466 filed Nov. 17, 1993, now abandoned.

BACKGROUND OF THE INVENTION

1. Field of the Invention

The present invention relates to a semiconductor test method using semiconductor test equipment that uses a prober and a test head in combination, and more particularly to a semiconductor test method involving multiprobing whereby a plurality of semiconductor chips are tested simultaneously.

2. Description of the Related Art

In the manufacturing process for semiconductor chips, to increase manufacturing efficiency each individual semiconductor chip formed on a semiconductor wafer is tested by placing needle-tipped probes into contact with its electrode pads and by applying and detecting test signals through the probes. Chips that are found defective in testing are dropped from the subsequent assembly process. Semiconductor test equipment is used for such testing.

The semiconductor test equipment comprises two sections: a test head and a prober. The test head is the device that provides a test signal to be applied to each semiconductor chip and receives a corresponding output signal to check the semiconductor chip. The prober is the device used to connect the electrodes of each semiconductor chip to the corresponding terminals of the test head.

Semiconductor chips are produced in a checkerboard pattern on a semiconductor wafer, and after the test is completed, the individual chips are separated before being passed to the assembly process. Hundreds of semiconductor chips are formed on a single semiconductor wafer. The recent trend is toward larger-diameter wafers to increase manufacturing efficiency, and with this trend, the number of semiconductor chips that are contained on one semiconductor wafer has been increasing. This has necessitated a further improvement in semiconductor test efficiency, and various approaches have been taken to achieve the purpose. One such approach is a technique known as multiprobing whereby a plurality of semiconductor chips are tested simultaneously.

Test head performance has also been improved, and nowadays, test heads are capable of testing a plurality of semiconductor chips simultaneously in a single operation of placing the probes into contact with the electrode pads, unless the semiconductor chips are very complex in structure. This has brought about the technique of multiprobing in which the probes are arranged in a plurality of groups, each group consisting of the number of probes needed to test one semiconductor chip, so that a plurality of adjacent semiconductor chips can be tested simultaneously in a single operation of placing the probes into contact with the electrodes of the chips. Multiprobing is a very effective technique, and the total test time for one semiconductor wafer can be reduced drastically. Specifically, as the number of semiconductor chips that can be tested simultaneously is increased, the total test time can be reduced accordingly.

In a previous multiprobing method, however, the number of semiconductor chips that can be tested simultaneously is limited to 2, 4, and so on, i.e., to a number given as a power of 2, and the test is performed by selecting an appropriate number according to the semiconductor chips to be tested. More specifically, in the previous multiprobing method, the semiconductor chips are divided into groups, for example, of 8, according to the number of chips to be tested simultaneously, and the test is performed on each group, like testing a single chip, by regarding each group as one of the chips arranged in a checkerboard pattern. Therefore, groups that do not contain any semiconductor chips are regarded as being nonexistent and the test is not performed on such groups; on the other hand, for any group that contains even one semiconductor chip, the probes are moved into contact with the device to carry out the test. As a result, in some situations, the test is performed with some of the probes not in actual use, and it cannot be said that the test is efficient enough. It is desirable that the number of test operations needed to test all the chips on a wafer be minimized since the total test time is proportional to the number of test operations performed. Reducing the test time is needed by improving this point.

Furthermore, semiconductor test equipment has a wafer moving device that moves the semiconductor wafer so that the individual chips on the wafer are positioned in contact with the probes. Since the wafer moving device performs moving operations that require high accuracy, an increased moving range would increase the size and cost of the equipment.

SUMMARY OF THE INVENTION

It is an object of the present invention to provide a multiprobing semiconductor test method capable of testing semiconductor chips with high efficiency without entailing an increase in the moving range of the wafer moving device.

The multiprobing semiconductor test method of the invention involves placing probes into contact with the electrode pads of semiconductor chips on a semiconductor wafer with a test head providing and receiving test signals through the probes thereby checking the electrical properties of the semiconductor chips sequentially. According to the invention, in order to test a plurality of adjacent semiconductor chips simultaneously, as many probes are provided as the plurality of semiconductor chips, the test head provides and receives test signals for the plurality of semiconductor chips simultaneously, and the number of semiconductor chips to be tested simultaneously is determined without being limited to a power of 2.

The maximum number of semiconductor chips that can be tested simultaneously is determined by the test capacity of the test head and the functional complexity of the semiconductor chips, for example, the number of input/output terminals provided on the test head and the number of electrode pads on each semiconductor chip. In the prior art, however, the actual number of chips that can be tested simultaneously is limited to the highest power of 2 within the theoretical maximum number. A major reason that the actual number is limited to such a value is that the number of chips that can be input to the test head is limited to such a value, and not because of inherent problems whatsoever.

According to the invention, the number of semiconductor chips to be tested simultaneously is made equal to the maximum number determined by the test capacity of the test head and the functional complexity of the semiconductor chips. This increases the number of semiconductor chips to be tested simultaneously by multiprobing, thus increasing the test efficiency.

According to a second mode of the invention, when each column of chips, which extends along the direction that the semiconductor chips to be tested simultaneously are arranged, is divided into groups each for simultaneous testing, the total number of semiconductor chips contained in the groups at both ends of the column is made larger than the number of semiconductor chips to be tested simultaneously.

When each column of chips is divided into groups each for simultaneous testing, there are regions where the number of semiconductor chips contained in the groups at both ends of the column is smaller than the number of chips to be tested simultaneously. In the prior art, each group of semiconductor chips to be tested simultaneously was regarded as one chip, assuming that the groups of chips were arranged in a checkerboard pattern. Therefore, even in regions where the number of semiconductor chips contained in each column is very small and the total number of chips that could be assigned to the groups at both ends is smaller than the number of semiconductor chips to be tested simultaneously, the semiconductor chips were divided between the two groups. On the other hand, in the second mode of the invention, the total number of semiconductor chips contained in the groups at both ends of each column is made larger than the number of chips to be tested simultaneously, and therefore, in the above case, the number of groups contained in the column is reduced by one. Rearranging the groups in this manner involves shifting the dividing position between groups from that in the adjacent column, and the groups are no longer arranged in an exact checkerboard pattern. However, in actual operation, the groups need not be arranged in an exact checkerboard pattern; rather, by reducing the number of groups, the test efficiency increases.

According to a third mode of the invention, when each column of chips, which extends along the direction that the semiconductor chips to be tested simultaneously are arranged, is divided into groups each for simultaneous testing, the difference in the number of semiconductor chips between the groups at both ends of the column is made equal to or less than 1.

In the third mode of the invention, when each column of chips is divided into groups, the difference in the number of semiconductor chips between the groups at both ends of the column is made equal to or less than 1, so that the two groups are located at positions substantially symmetrical with respect to the center of the semiconductor wafer. This arrangement reduces the moving range of the wafer chuck as compared to an arrangement in which one group is farther away from the center than the other group is.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Before proceeding to a detailed description of the preferred embodiment of the present invention, prior art semiconductor test methods will be described first with reference to the accompanying drawings relating thereto for a clearer understanding of the difference between the prior art and the present invention.

Figure 1:
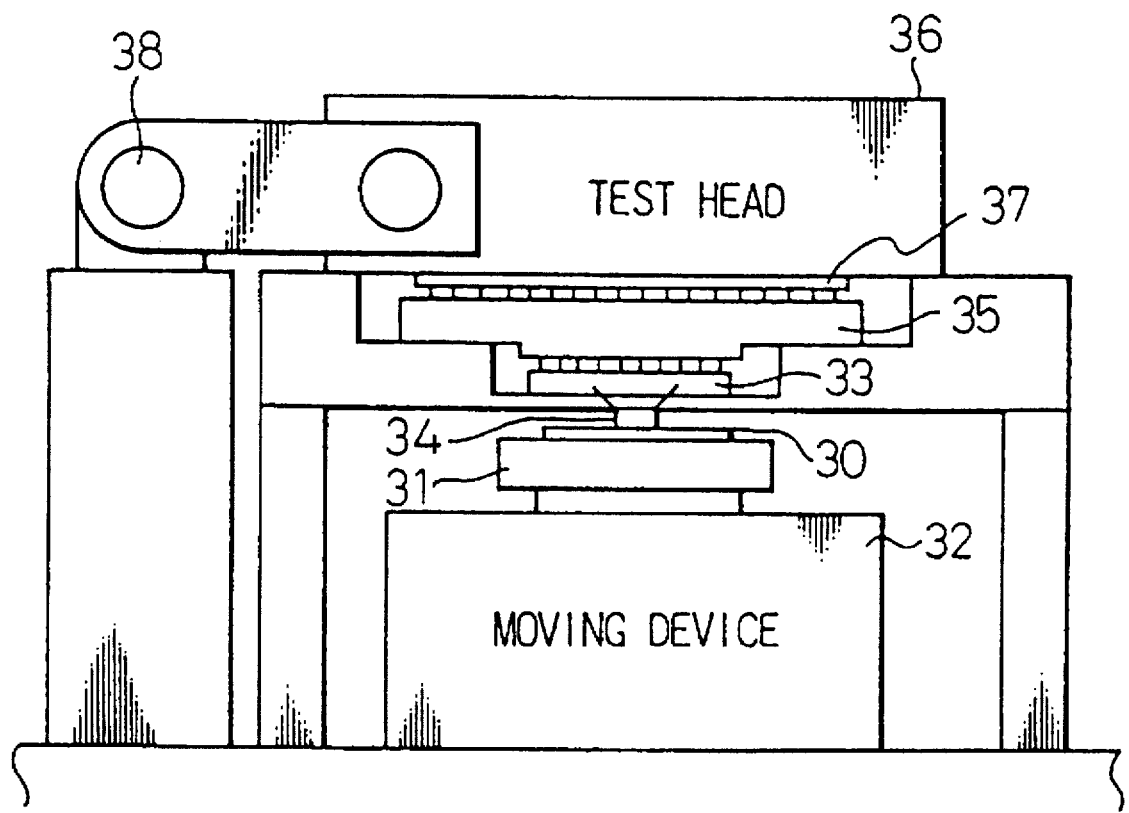
FIG. 1 is a diagram showing the construction of semiconductor test equipment.

FIG. 1 is a diagram showing the construction of semiconductor test equipment.

In FIG. 1, the reference numeral 30 designates a semiconductor wafer as the workpiece, containing semiconductor chips on its surface. The numeral 31 is a wafer chuck for holding the semiconductor wafer by vacuum, and 32 is a moving device for moving the wafer chuck in three-dimensional directions. The numeral 33 indicates a probe card having probes 34 which contact the electrode pads of semiconductor chips. The probe card 34 has, on its upper surface, connecting terminals electrically connected to the probes. The numeral 35 is a frog ring, a connecting member for connecting the connecting terminals of the probe card 33 to the test head 36.

The test head 36 outputs test signals which are applied to semiconductor chips, and receives corresponding output signals to check the semiconductor chips. The test head 36 is provided with a performance board 37 for connection to the frog ring. The test head 36, with the performance board 37 attached to it, is swingable about a rotating shaft 38 and separable from other sections of the equipment. The sections of the equipment, other than the test head section, are generally called a prober.

Figure 2:
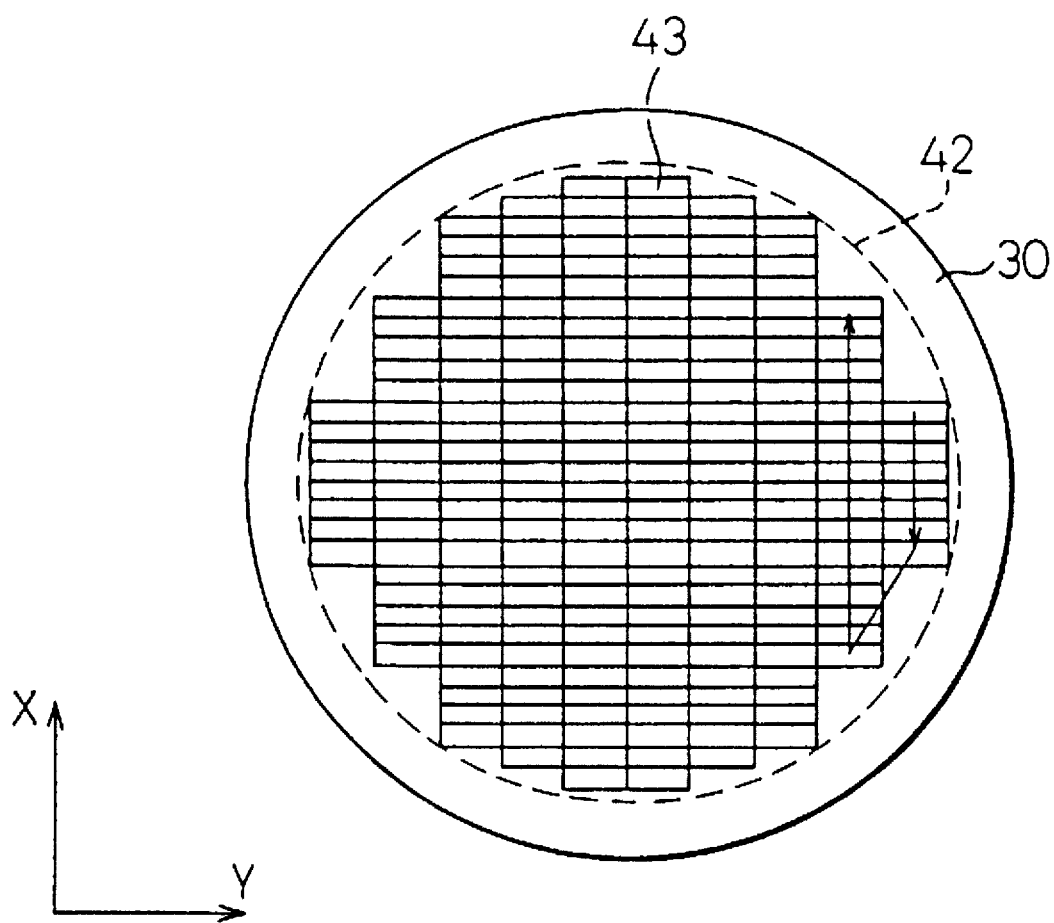
FIG. 2 is a diagram showing a semiconductor wafer and an array of semiconductor chips formed thereon.

FIG. 2 is a diagram showing semiconductor chips formed on a semiconductor wafer. In the figure, the semiconductor wafer is indicated at 30 and the semiconductor chips at 43. Usually, viable semiconductor chips cannot be formed in the peripheral regions of the semiconductor wafer 30; viable regions where good semiconductor chips can be formed are those regions surrounded by a circle 42 in the figure. The following description is given using diagrams showing semiconductor chips formed in the viable regions.

As shown in FIG. 2, the semiconductor chips 43 are arranged in a checkerboard pattern on the semiconductor wafer 30, and after the test is completed, the individual chips are separated before being passed to the assembly process. In testing, the semiconductor wafer 30 is held on the wafer chuck 31 and positioned properly, and the wafer chuck 31 is moved so that the electrode pads are placed into contact with the probes 34. The test is performed on each semiconductor chip, progressing along the arrow direction shown in the right side of FIG. 2. All the semiconductor chips are thus tested to complete the testing of one semiconductor wafer.

Hundreds of semiconductor chips are formed on one semiconductor wafer. The recent trend is toward larger-diameter wafers to increase the manufacturing efficiency, and with this trend, the number of semiconductor chips that are formed on one semiconductor wafer has been increasing. This has necessitated a further improvement in semiconductor test efficiency, and various approaches have been made to achieve the purpose. One such approach is a technique known as multiprobing whereby a plurality of semiconductor chips are tested simultaneously. The test head performance has also been improved, and nowadays, the test head is capable of testing a plurality of semiconductor chips simultaneously in a single operation of placing the probes into contact with the electrode pads, unless the semiconductor chips are very complex in structure. This has brought about the technique of multiprobing in which the probes are arranged in a plurality of groups, each group consisting of the number of probes needed to test one semiconductor chip, so that a plurality of adjacent semiconductor chips can be tested simultaneously in a single operation of placing the probes into contact with the electrodes of the chips.

In the prior art multiprobing method, the number of semiconductor chips that can be tested simultaneously is limited to 2, 4, and so on, i.e., to a number given as a power of 2, and the test is performed by selecting an appropriate number according to the semiconductor chips to be tested. As previously described, a major reason that the actual number is limited to such a value is that the number of chips that can be input to the test head is limited to such a value, and not because of inherent problems whatsoever.

Figure 3:
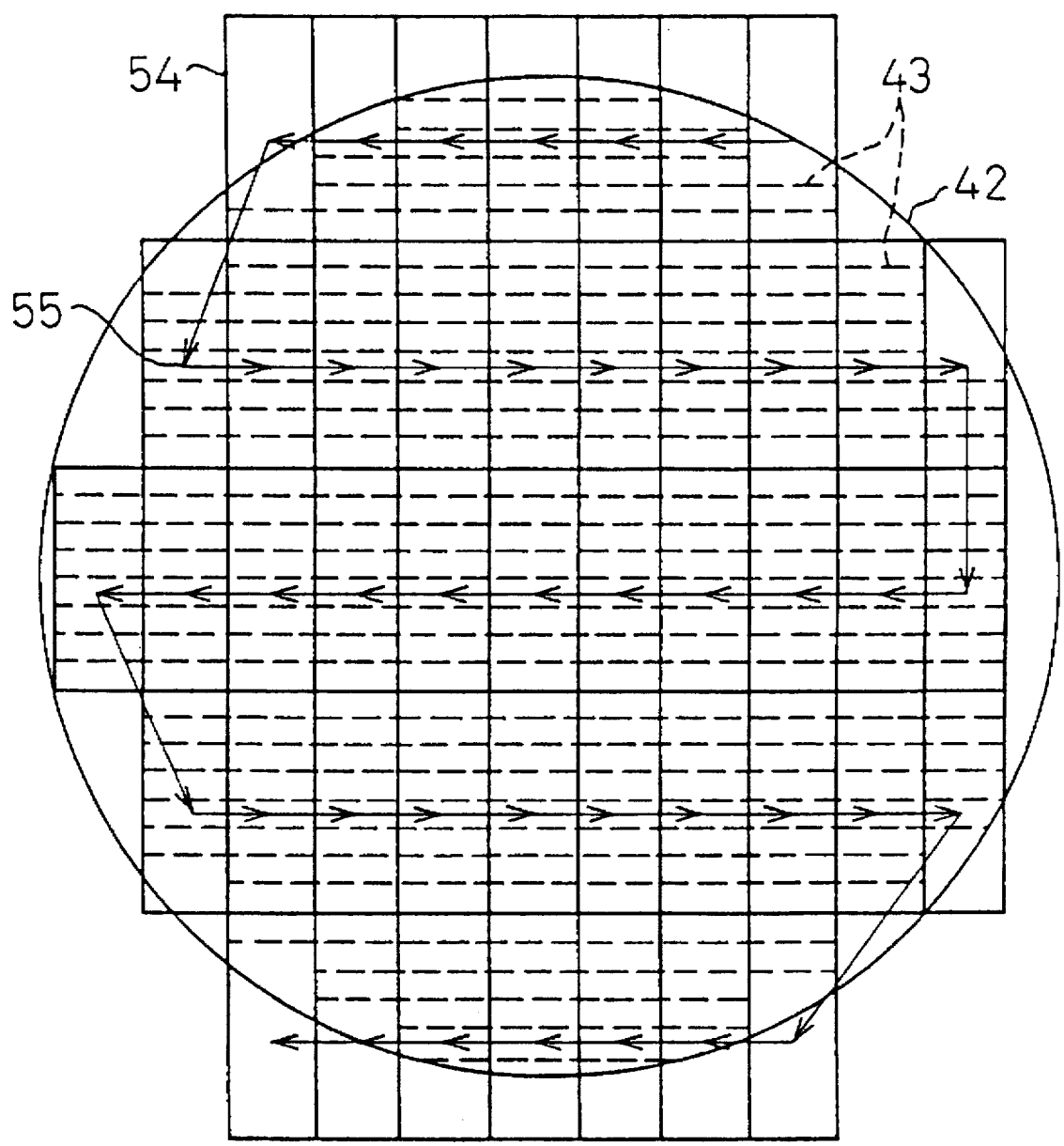
FIG. 3 is a diagram showing the division of chips and the probe path according to a prior art multiprobing method.

FIG. 3 is a diagram showing the arrangement of groups of semiconductor chips and the probe path according to the prior art multiprobing method for testing a semiconductor wafer. The reference numeral 42 indicates a viable range of the semiconductor wafer, and dashed lines 43 indicate semiconductor chips. The numeral 54 shows a group of semiconductor chips to be tested simultaneously. Considering the processing capacity of the test head and the functional complexity of the chips, it would be possible theoretically to test 12 chips simultaneously, but in the example shown, the highest power of 2 not larger than 12 is taken and eight semiconductor chips are tested simultaneously.

In the prior art multiprobing method, each group of eight semiconductor chips that are tested simultaneously is regarded as one of the chips that are arranged in a checkerboard pattern, and the test is performed, like testing a single chip, in the sequence as shown in FIG. 3. Therefore, groups that do not contain any semiconductor chips are regarded as being nonexistent and the test is not performed on such groups; on the other hand, for any group that contains even a single semiconductor chip, the probes are moved into contact with the device to carry out the test.

In the example of FIG. 3, the total number of semiconductor chips is 284, and if eight chips are tested simultaneously in one test operation, all the chips should be able to be tested in a total of 36 test operations; in actuality, however, a total of 45 test operations, each involving moving the probes into contact with the device, is needed to complete the testing of all the chips. If the number of test operations could be reduced closer to 36, the test time could be reduced accordingly.

Figure 4:
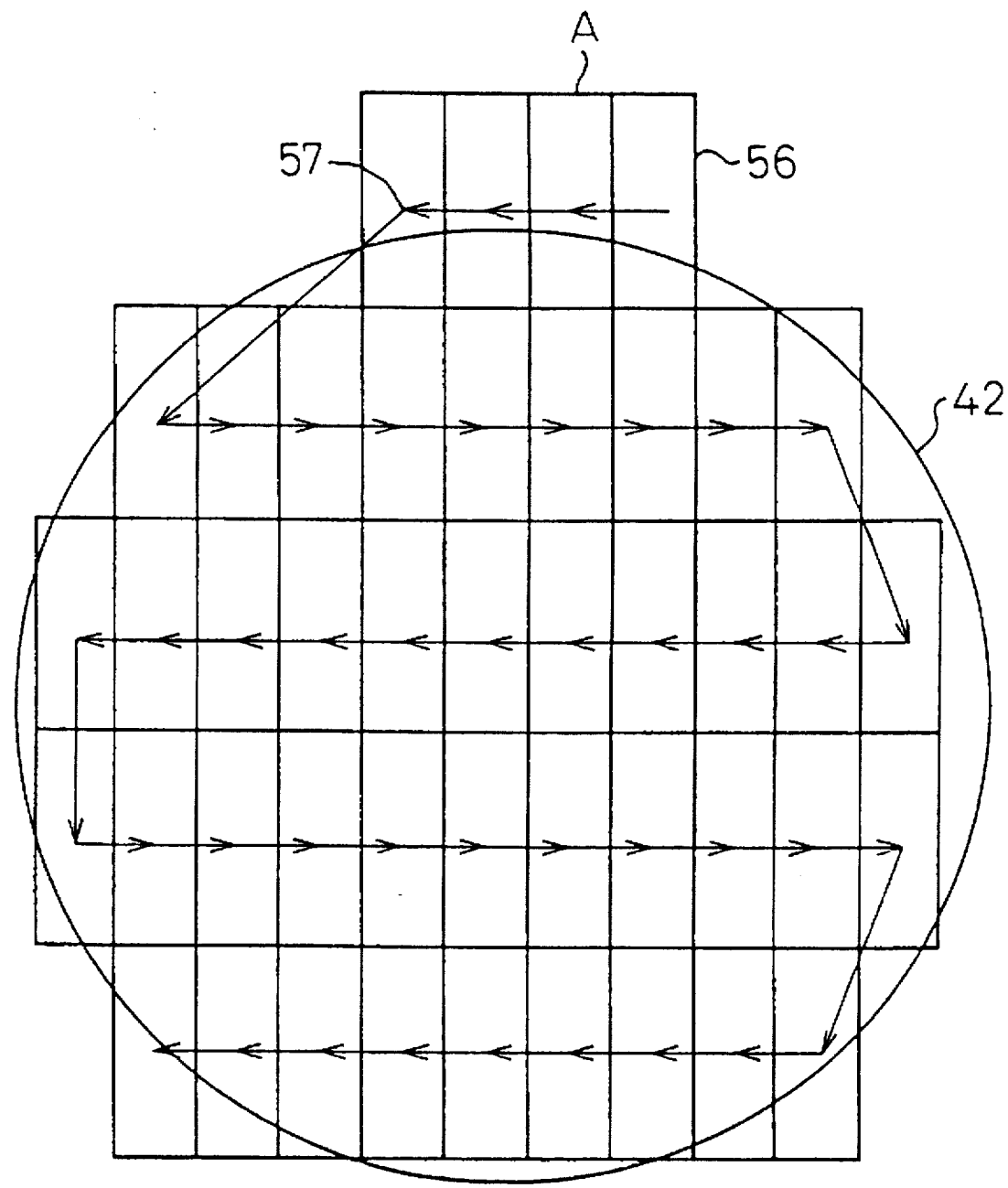
FIG. 4 is a diagram showing an alternative example of the prior art multiprobing method.

FIG. 4 is a diagram showing another example of the multiprobing method in which the semiconductor chips formed on the same semiconductor wafer as shown in FIG. 3 are tested 8 chips at a time. This example requires a total of 44 test operations, each involving moving the probes into contact with the device; the number of operation required is reduced by one as compared to the prior art example of FIG. 3, thus improving the test efficiency by that amount. However, the probe position, that is, the center position of the probe card, when testing the semiconductor chips in the center uppermost portion of the wafer, is shifted upward as compared with the example of FIG. 3. The center position of the probe card, relative to the center position of the semiconductor wafer, determines the required moving range of the wafer moving device. The distance between these two centers in FIG. 4 is greater than that in FIG. 3, which means that the moving range must be made larger to cover the increased distance.

Figure 5:
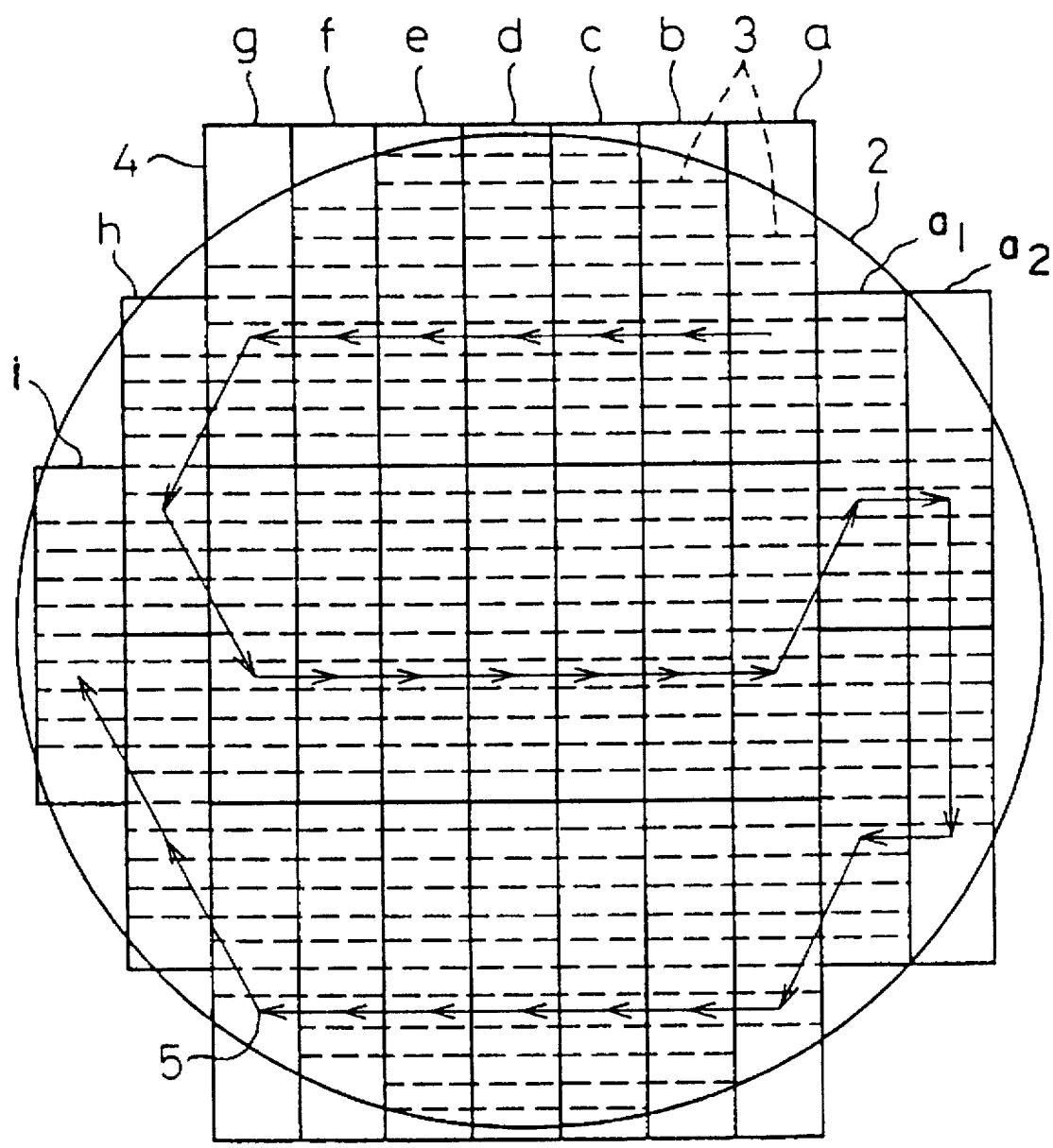
FIG. 5 is a diagram showing the division of chips and the probe path according to a multiprobing method in one embodiment of the invention.

FIG. 5 shows the arrangement of groups of semiconductor chips to be tested simultaneously and the probe path according to a multiprobing method in one embodiment of the present invention. Semiconductor test equipment, similar to the one shown in FIG. 1, is used in this embodiment.

In FIG. 5, the numeral 2 designates a semiconductor wafer, and 3 indicates semiconductor chips. The numeral 4 denotes a group of semiconductor chips to be tested simultaneously, and 5 shows a path along which a position of the probe card is moved over the semiconductor wafer 2.

The semiconductor wafer shown in FIG. 5 is the same as the one shown in FIG. 3.

In this embodiment, it is assumed that, considering the functional complexity of the semiconductor chips, the test head has the capability of testing 12 semiconductor chips simultaneously, as previously mentioned, and therefore that the number of semiconductor chips to be tested simultaneously is set at 12. Along the vertical center line of the wafer are formed 34 semiconductor chips, which are divided into three groups; as shown in FIG. 5, the upper and lower groups each consisting of 11 semiconductor chips.

As shown, the test is performed starting from one of the groups within the columns, and in this example from the upper right group "a". Testing then progresses in FIG. 5 in sequence toward the left, thus testing the seven adjacent groups. The next column of chips contain only 12 chips, which are divided into two groups. After testing the upper group "h", the test is performed starting with the group below group "h" and progressing in sequence toward the right. This test operation is sequentially performed until the testing of all the chips is completed.

In FIG. 5, the number of test operations, each involving moving the probes into contact with the device, is 28 in total, which is a significant reduction as compared with the examples of FIGS. 3 and 4.

In this embodiment, the number of semiconductor chips to be tested simultaneously is set at 12, and the difference in the number of chips between the groups at both ends of each column is kept to 1 or less. Furthermore, each column of chips is divided into as few groups as possible. Therefore, when the number of groups contained is different between adjacent columns, (i.e. see for example columns g vs. h, a vs. $a_1$ or h vs. i) the center position of each group in one column is displaced from the corresponding position in the adjacent column by half the group length, i.e., by the total width of six semiconductor chips. When the number of groups between adjacent columns is the same, the center portion of each group in one column is not displaced from the corresponding portion in the adjacent column (i.e. see columns a through g, or $a_1$ through $a_2$). If the number of semiconductor chips to be tested simultaneously is set at 13, the displacement will be equal to the total width of six or seven semiconductor chips.

Figure 6A:
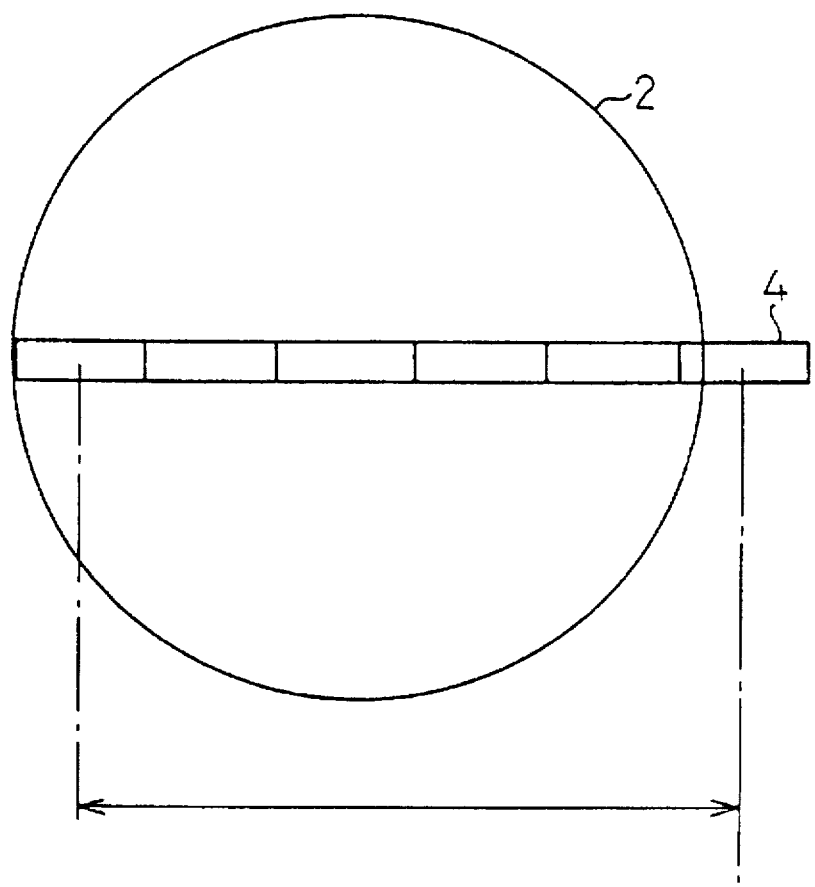
FIGS. 6A and 6B are diagrams for explaining the difference in wafer moving range.
Figure 6B:
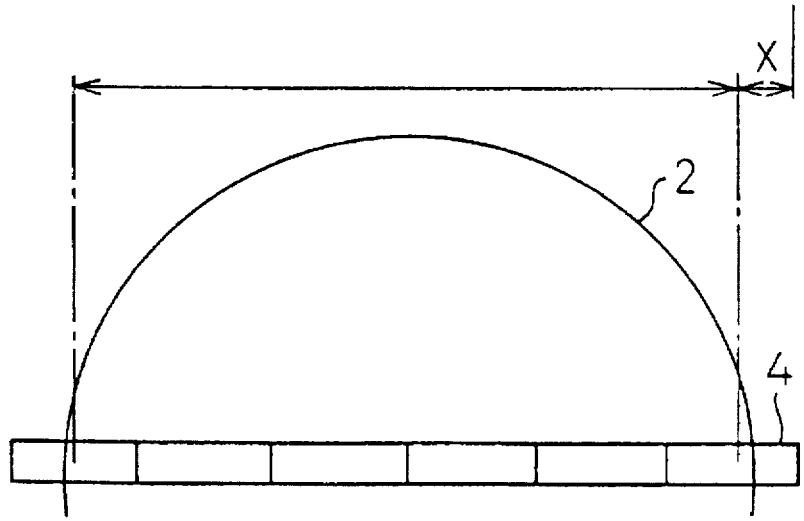

FIGS. 6(A)–6(B) show a comparison between an arrangement in which the difference in the number of semiconductor chips between the groups at both ends of each column is limited to 1 or less and an arrangement in which no such limit is imposed and the chips are divided in sequence into groups by simply progressing from one edge toward the other. The top diagram shows the latter arrangement in which the chips are divided in sequence into groups by simply progressing from one edge toward the other, and the bottom diagram shows the former arrangement in which the difference in the number of chips between the two groups is kept to a minimum. As shown, in the arrangement in the top diagram, the rightmost group extends significantly beyond the limit of the moving range 2, whereas in the arrangement in the bottom diagram, portions extending outside the limit are kept to a minimum. The range within which the center of the probe card is moved is indicated by a double-headed arrow. It can be seen that the moving range is in proportion at right and left in the arrangement shown in the bottom diagram. Since the moving range is determined by the distance from the center to the edge, the moving range needs to be increased by the amount indicated by "x" in the case of the arrangement shown in the top diagram.

As can be understood from the above description, the multiprobing semiconductor method of the invention achieves a significant improvement in test efficiency without increasing the moving range of the semiconductor wafer.

I claim:

1. In semiconductor test equipment, in which probes are placed into contact with the electrode pads of semiconductor chips on a semiconductor wafer and a test head provides and receives test signals through said probes thereby checking the electrical properties of said semiconductor chips sequentially, a multiprobing semiconductor test method comprising the steps of:
   to test a plurality of adjacent semiconductor chips simultaneously, providing as many probes as the number of semiconductor chips to be tested simultaneously;
   providing said test head which is capable of providing and receiving test signals for said plurality of semiconductor chips simultaneously; and
   dividing each column of chips into groups, said column extending along the direction that said semiconductor chips to be tested simultaneously are arranged, each group being for simultaneous testing, when the number of groups in adjacent columns is different, displacing a center position of one of the groups in the adjacent column from a corresponding center position of a group in the other adjacent column such that the groups are not arranged in a straight line in a row direction with a group in an adjacent column, and when the number of groups in adjacent columns is the same, the center position of groups in adjacent columns are arranged adjacently such that the groups are arranged in a straight line in a row direction with a group in an adjacent column.

2. Multiprobing semiconductor test method according to claim 1, wherein said step of dividing each said column of chips into groups each for simultaneous testing, further comprising the step of determining a difference in the number of semiconductor chips between the groups at both ends of said column to be not greater than 1.

3. A multiprobing semiconductor test method for semiconductor test equipment, said semiconductor test equipment having probes and a test head, said probes being placed into contact with electrode pads of semiconductor chips on a semiconductor wafer, said test head providing and receiving test signals through said probes, therein checking electrical properties of said semiconductor chips sequentially, said multiprobing semiconductor test method comprising the steps of:
   determining a basic number of semiconductor chips to be tested simultaneously;
   determining a number of semiconductor chips formed along each column of the semiconductor wafer;
   determining a number of groups of semiconductor chips in each column for simultaneously testing by dividing the number of semiconductor chips in each column by the basic number of semiconductor ships to be tested simultaneously;
   when the number of groups in adjacent columns is the same, a center position of groups in adjacent columns are arranged adjacently;
   when the number of groups in adjacent columns is different, displacing a center position of one of the groups in the adjacent columns from a corresponding center position of a group in the other adjacent column by half the basic number, wherein groups at ends of a row of columns are not arranged in a straight line in a row direction with a group in the adjacent column;
   providing as many probes as the basic number of semiconductor chips to be simultaneously tested at a center position of a first group;
   providing said test head and testing said first group; and
   sequentially moving to each center position of an adjacent group and testing until all the semiconductor chips on the wafer are tested.

4. A multiprobing semiconductor test method according to claim 3, wherein said step of displacing a center position, further comprising the step of determining a difference in the number of semiconductor chips between the groups at both ends of said column to be not greater than 1.

* * * * *